United States Patent
Skocki

(10) Patent No.: US 7,129,558 B2
(45) Date of Patent: Oct. 31, 2006

(54) CHIP-SCALE SCHOTTKY DEVICE

(75) Inventor: Slawomir Skocki, Cirie (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/289,486

(22) Filed: Nov. 6, 2002

(65) Prior Publication Data

US 2004/0084770 A1    May 6, 2004

(51) Int. Cl.
*H01L 27/095* (2006.01)
*H01L 29/00* (2006.01)
*H01L 23/48* (2006.01)

(52) U.S. Cl. .................. 257/484; 257/452; 257/476; 257/483; 257/738

(58) Field of Classification Search ........ 257/449–457, 257/471–486, 737–738
See application file for complete search history.

(56) References Cited

U.S. PATENT DOCUMENTS

| 4,250,520 | A |   | 2/1981  | Denlinger |
| 4,669,180 | A | * | 6/1987  | Thomas et al. ............. 438/384 |
| 5,477,067 | A | * | 12/1995 | Isomura et al. ............. 257/211 |
| 5,899,714 | A | * | 5/1999  | Farrenkopf et al. ......... 438/202 |
| 6,049,108 | A | * | 4/2000  | Williams et al. ............ 257/341 |
| 6,124,179 | A | * | 9/2000  | Adamic, Jr. ................ 438/309 |
| 6,653,740 | B1 | * | 11/2003 | Kinzer et al. ............... 257/778 |
| 6,682,968 | B1 | * | 1/2004  | Asano et al. ............... 438/237 |

* cited by examiner

*Primary Examiner*—Ori Nadav
(74) *Attorney, Agent, or Firm*—Ostrolenk, Faber, Gerb, & Soffen, LLP

(57) ABSTRACT

A chip-scale schottky package which has at least one cathode electrode and at least one anode electrode disposed on only one major surface of a die, and solder bumps connected to the electrode for surface mounting of the package on a circuit board.

29 Claims, 6 Drawing Sheets

CHIP-SCALE SCHOTTKY DEVICE

FIELD OF INVENTION

The present invention relates to semiconductor devices and more particularly a chip-scale schottky device.

BACKGROUND OF THE INVENTION

Conventional semiconductor devices, such as surface mounted devices (SMDs), typically include a semiconductor die, a lead frame having external leads, and a housing which may be molded out of a plastic material. In such conventional devices, the external leads act as electrical connections for the semiconductor die as well as support for the device, while the housing provides protection for the semiconductor die by encapsulating the same. Naturally, to encapsulate the semiconductor die the housing itself must be larger than the semiconductor die. Also, the external leads often extend laterally out of the housing thus further increasing the area occupied by the device.

Due to the increase in the demand for higher performance portable appliances such as cell phones, portable computers, personal digital assistants, etc. there has been an ever increasing need for semiconductor devices that provide higher power density but occupy less space on the circuit board in order to improve performance while reducing the size. To address the need for miniaturization, chip-scale devices for semiconductor switching die such as MOSFETs have been proposed. Chip-scale packages are the size of, or nearly the size of a semiconductor die and thus occupy less area on the circuit board than the conventional semiconductor packages. To ensure that the chip-scale device will be the size of or nearly the size of the semiconductor die, the electrodes of the die are provided on only one surface so that the die may be connected to conductive pads of, for example, a printed circuit board, by, for example, appropriately positioned solder bumps. Such a configuration is conventionally referred to as a flip chip. U.S. Pat. No. 4,250,520 discloses an example of a flip chip device. The flip chip device proposed by U.S. Pat. No. 4,250,520 is not, however, a chip-scale device in that the substrate on which the semiconductor die is formed occupies a relatively larger area than the die itself.

Schottky diodes are components that are prevalently used in electronic circuits. It is thus desirable to have a chip-scale schottky package in order to contribute to the miniaturization of electronic circuits.

SUMMARY OF THE INVENTION

A schottky diode according to prior art includes an anode electrode disposed on one major surface of a die and a cathode electrode disposed on an opposing major surface of the die. To package a conventional schottky diode, therefore, a lead structure must be provided to adapt the package for surface mounting.

According to an aspect of the present invention, a schottky device is provided that includes a schottky die having a first portion which is lightly doped with dopants of a first conductivity type and a second portion which is highly doped with dopants of the first conductivity type. The first portion of the die is disposed over its second portion and includes a major surface on which a schottky barrier layer is disposed. An electrode, which may be the anode electrode, is disposed over and electrically connected to the schottky barrier layer. The first portion of the die also includes a sinker which extends from the major surface of the first portion to the second portion. The sinker is highly doped with dopants of the first conductivity type. An electrode, which may be a cathode electrode is disposed over and electrically connected to the sinker. In addition, a passivation layer is disposed over the cathode and the anode electrodes. Solder bumps are connected to the cathode and the anode electrodes through respective openings in the passivation layer.

According to one embodiment of the present invention, the anode electrode covers a substantial area of a major surface of the first portion of the die and surrounds at least one cathode electrode also disposed on the same major surface of the die. In this embodiment, a guard ring is formed in the first portion of the die around the perimeter of the cathode electrode. The guard ring is a diffused region of opposite polarity to the polarity of the first and the second portion of the die.

According to another embodiment of the present invention, the anode electrode covers a substantial area of a major surface of the first portion of the die and is surrounded by at least one cathode electrode also disposed on the same major surface of the die. In this embodiment, a guard ring is formed in the first portion of the die around the perimeter of the anode electrode. The guard ring is a diffused region of opposite polarity to the polarity of the first and the second portion of the die.

Other features and advantages of the present invention will become apparent from the following description of the invention which refers to the accompanying drawings.

DETAILED DESCRIPTION OF THE FIGURES

Figure 1:
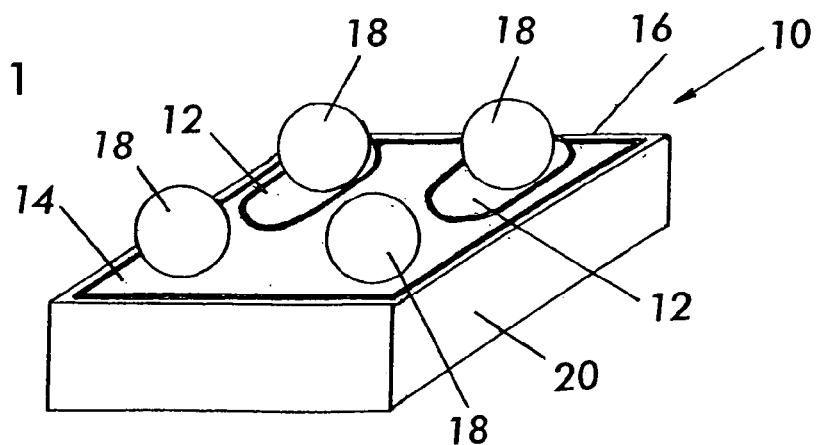
FIG. 1 is a perspective view of a device according to the first embodiment of the present invention.

FIG. 1 shows a first embodiment of a device 10 according to the present invention. Device 10 is preferably a schottky diode having two cathode electrodes 12 and an anode electrode 14 disposed on only one major surface 16 of die 20. In the first embodiment according to the present invention, two solder bumps 18 are provided on anode electrode 14 and a solder bump 18 is disposed on and electrically connected to a respective cathode electrode 12. Preferably, solder bumps 18 are spaced from one another and arranged so as to form a support structure when device 10 is mounted on a circuit board as will be described later.

Figure 3:
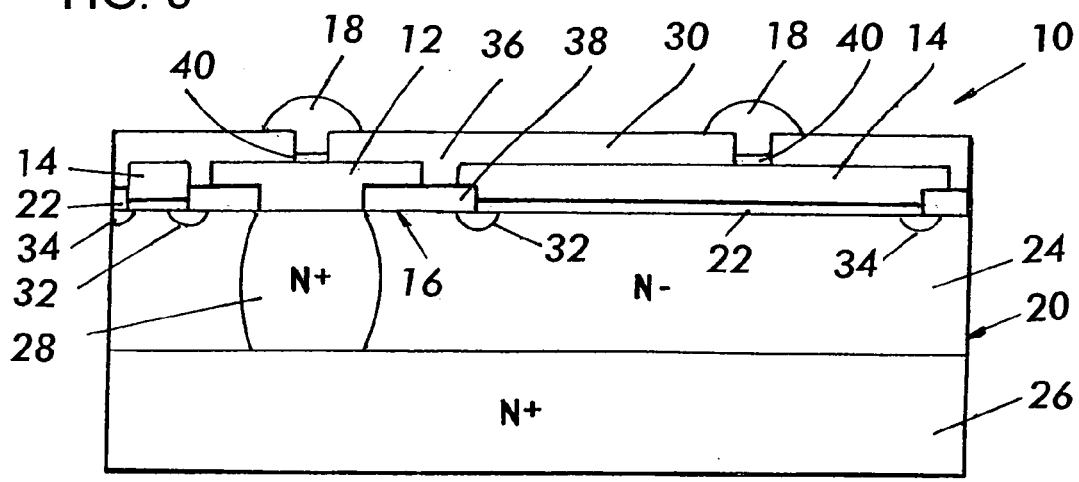
FIG. 3 is a cross-sectional view along line 3—3 in FIG. 2 viewed in the direction of the arrows.
Figure 2:
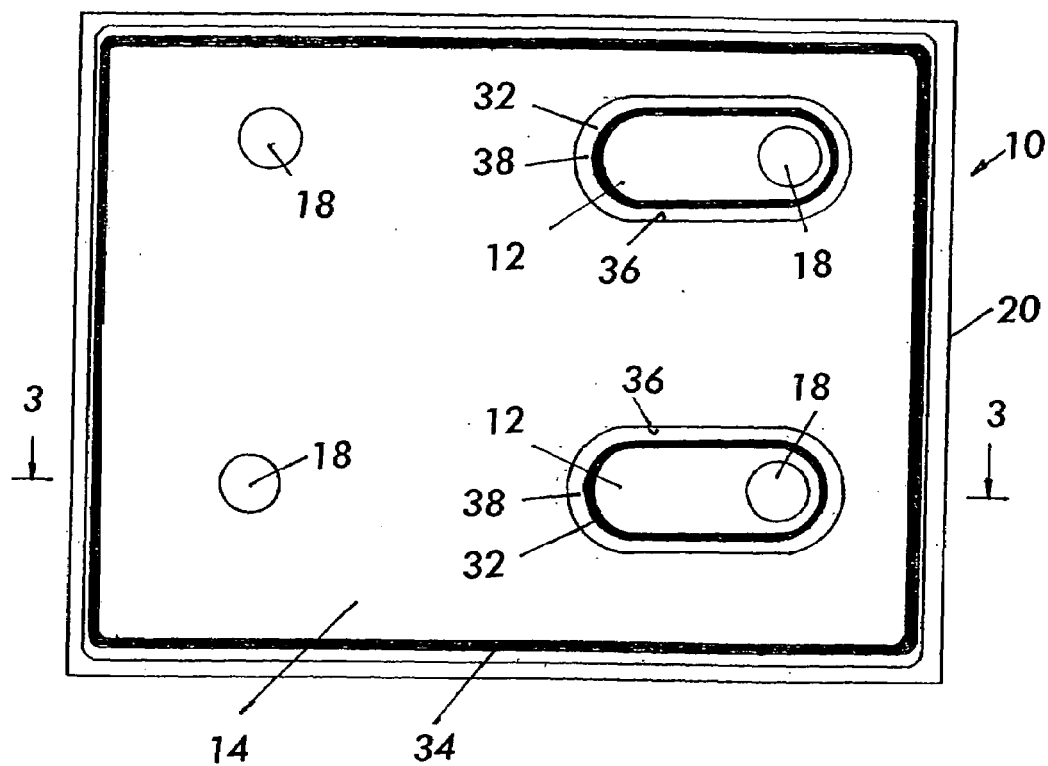
FIG. 2 is a top view of a device according to the first embodiment of the present invention.

Referring to FIGS. 2 and 3, anode electrode 14 is disposed over and electrically connected to schottky barrier layer 22, which is over and connected to major surface 16 of die 20. Die 20 includes first portion 24 which is disposed over second portion 26. First portion 24 of die 20 is lightly doped while second portion 26 is highly doped. In the preferred embodiment of the present invention, second portion 26 of die 20 is a silicon substrate that is highly doped with an N-type dopant, and first portion 24 of die 20 is an epitaxially grown silicon layer that is lightly doped with an N-type dopant.

Cathode electrode 12 in device 10 is ohmically connected to major surface 16 of die 20. Sinker 28 extends between cathode electrode 12 and second portion 26 of die 20. Sinker 28 is a highly doped region which, in the preferred embodiment, is doped with an N-type dopant.

Device 10 also includes passivation layer 30. Passivation layer 30 is disposed over cathode electrodes 12 and anode electrode 14. Passivation layer 30 includes openings through which solder bumps 18 are connected to respective electrodes.

In the embodiment shown by FIGS. 2 and 3, first guard rings 32 are provided around the perimeter of cathode electrodes 12 in first portion 24 of die 20. Also, a second guard ring 34 is provided around the outer perimeter of anode electrode 14 in first portion 24 of die 20. Guard rings 32, 34 are diffusions of dopants of opposite conductivity to dopants in the first portion 24 of die 20, and thus of the P-type in the preferred embodiment of the present invention. Each cathode electrode 12 is insulated from anode electrode 14 by the combination of a gap 36 and insulation layer 38 which is disposed around its periphery.

In the preferred embodiment of the present invention, schottky barrier layer 22 is composed of molybdenum, while cathode electrodes 12 and anode electrode 14 are composed of aluminum or an aluminum silicon alloy where appropriate. Of course, any other suitable material may be used for schottky barrier layer 22, cathode electrodes 12 and anode electrode 14. For example, vanadium or paladium may be used for schottky barrier layer 22. Also, in order to improve adhesion, preferably, a nickel flashing 40 may be disposed between the solder bumps 18 and the electrodes to which it is connected if the electrode is composed of, for example, aluminum silicon. Passivation layer 30 is preferably composed of silicon nitride or any other suitable material.

Figure 4:
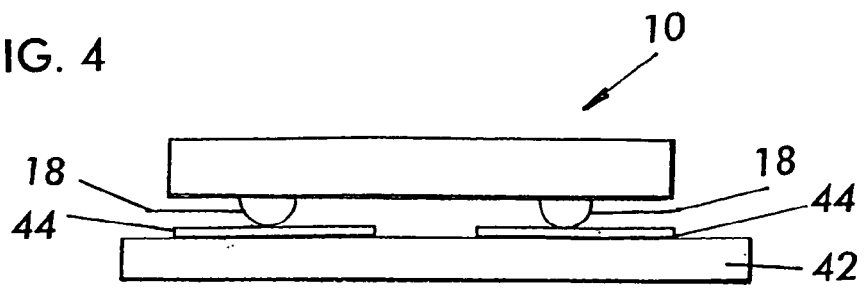
FIG. 4 shows a device according to the present invention as mounted on a printed circuit board.

FIG. 4 shows device 10 as mounted on a circuit board 42. The circuit board 42 includes conductive pads 44 to which solder bumps 18 are connected. When device 10 is operating, current travels between cathode electrodes 12 through the body of die 20 and anode electrode 14.

Figure 5:
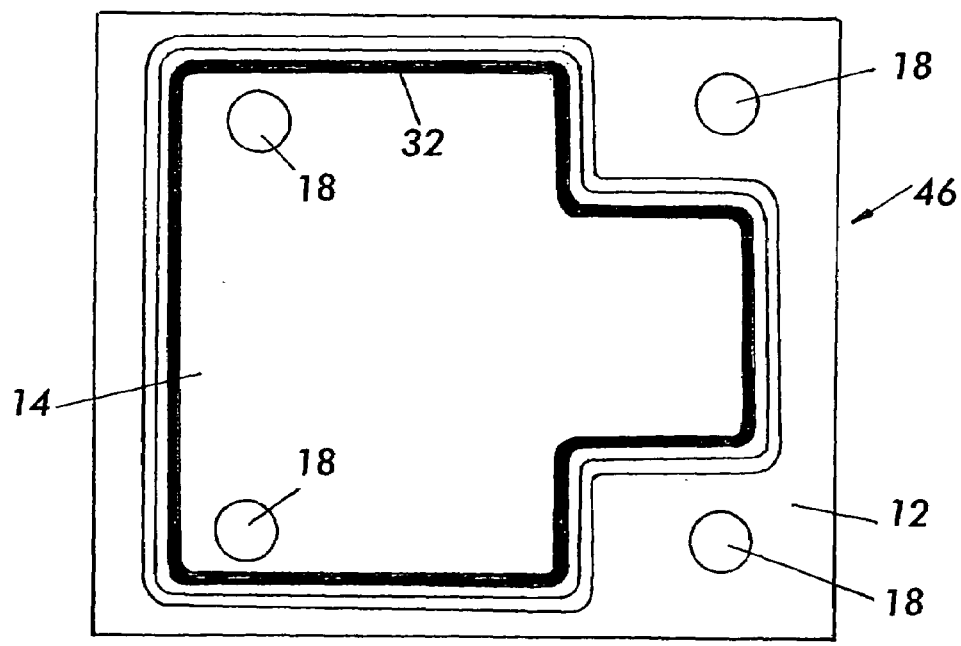
FIG. 5 shows the top view of a device according to the second embodiment of the present invention.
Figure 6:
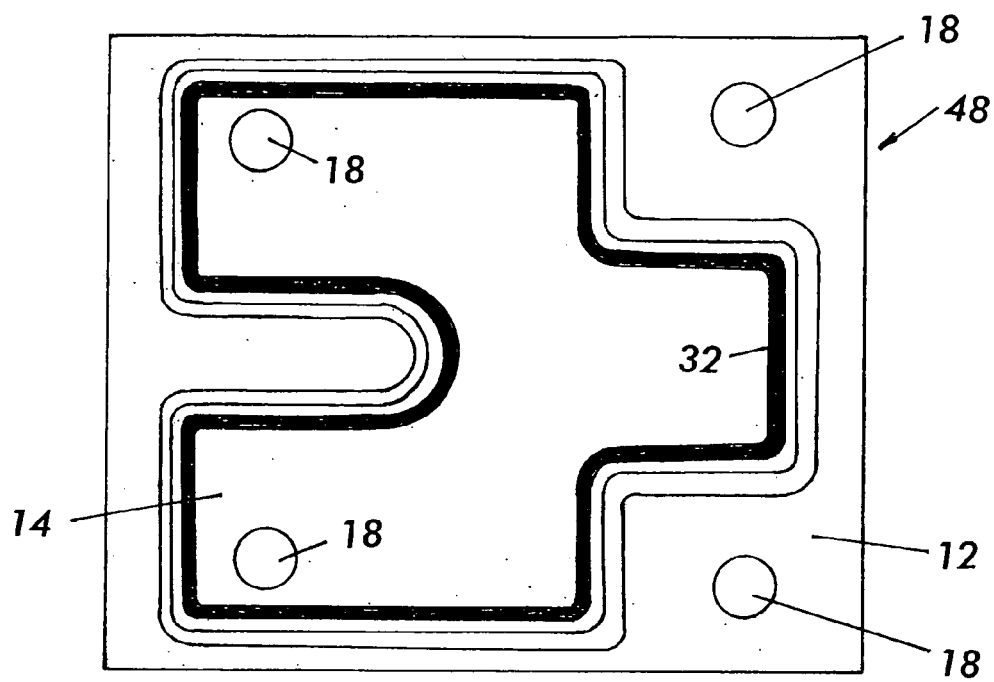
FIG. 6 shows the top view of a device according to the third embodiment of the present invention.
Figure 7:
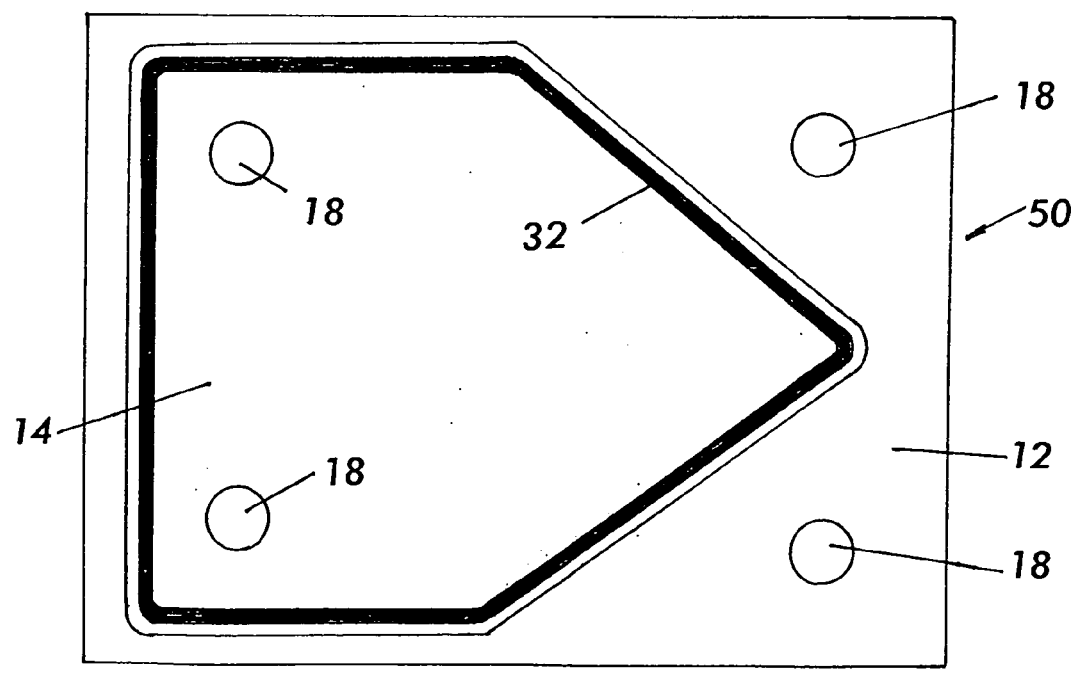
FIG. 7 shows the top view of a device according to the fourth embodiment of the present invention.

FIGS. 5, 6 and 7 show top views of devices according to the second 46, the third 48, and the fourth 50 embodiments of the present invention respectively. Referring first to FIG. 5, a device 46 according to the second embodiment of the present invention includes all of the features of the device 10 according to the first embodiment, except that instead of two cathode electrodes, device 46 includes a single cathode electrode 12 which surrounds the anode electrode 14.

Figure 8:
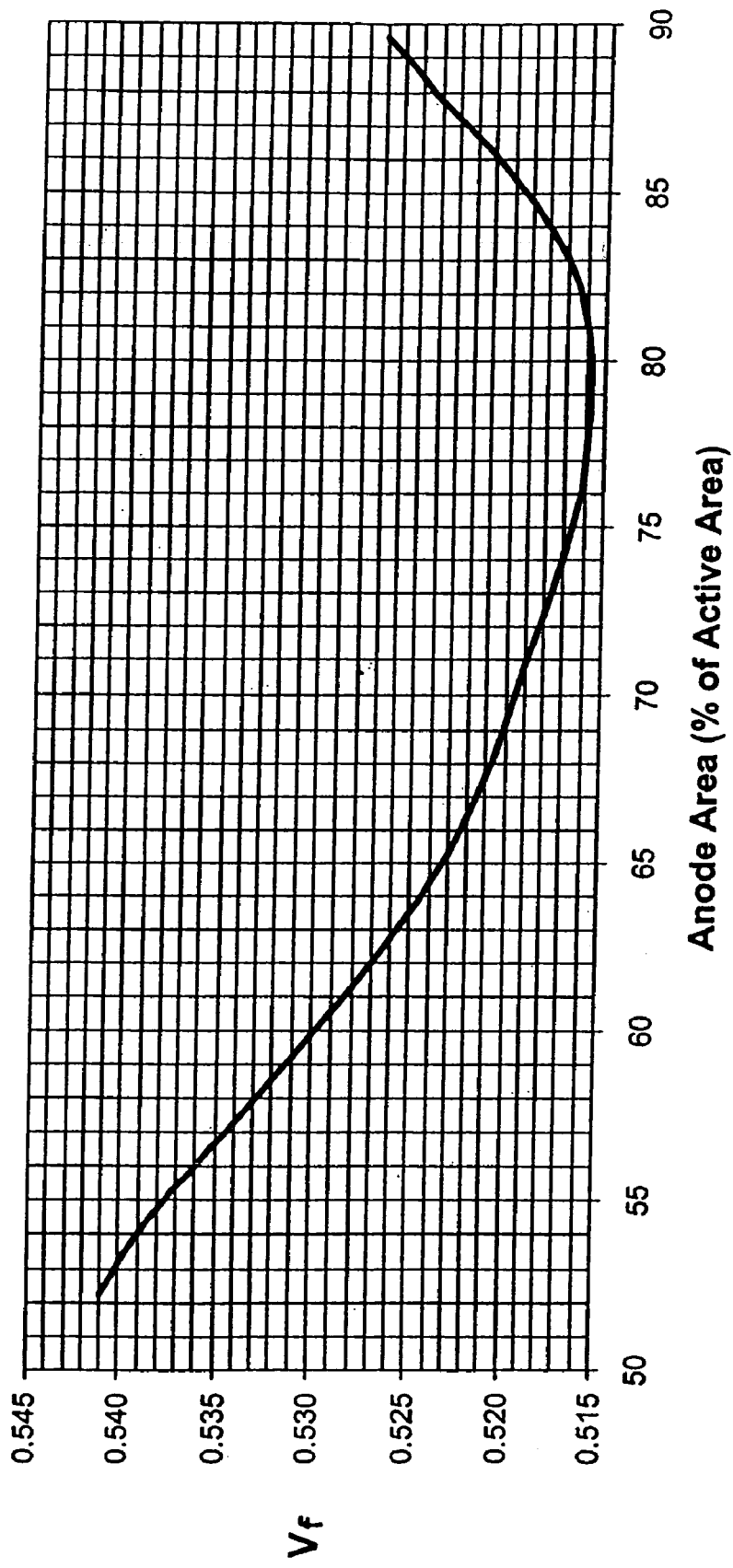
FIG. 8 graphically shows the variation of forward voltage ($V_F$) with the charge in the anode area.

Thus, according to an aspect of the present invention, the respective areas of anode electrode 14 and cathode electrode 12 may be varied to alter the performance characteristics of the device thereby achieving the desired performance for the device. For example, $V_F$ forward voltage, may be optimized by varying the respective areas of cathode and anode in a device according to the present invention. FIG. 8 shows that when the anode area covers more of the active area the $V_F$ drops, which is a desirable result. According to FIG. 8, when anode area is about 80% of the active area $V_F$ is at a minimum.

Figure 9:
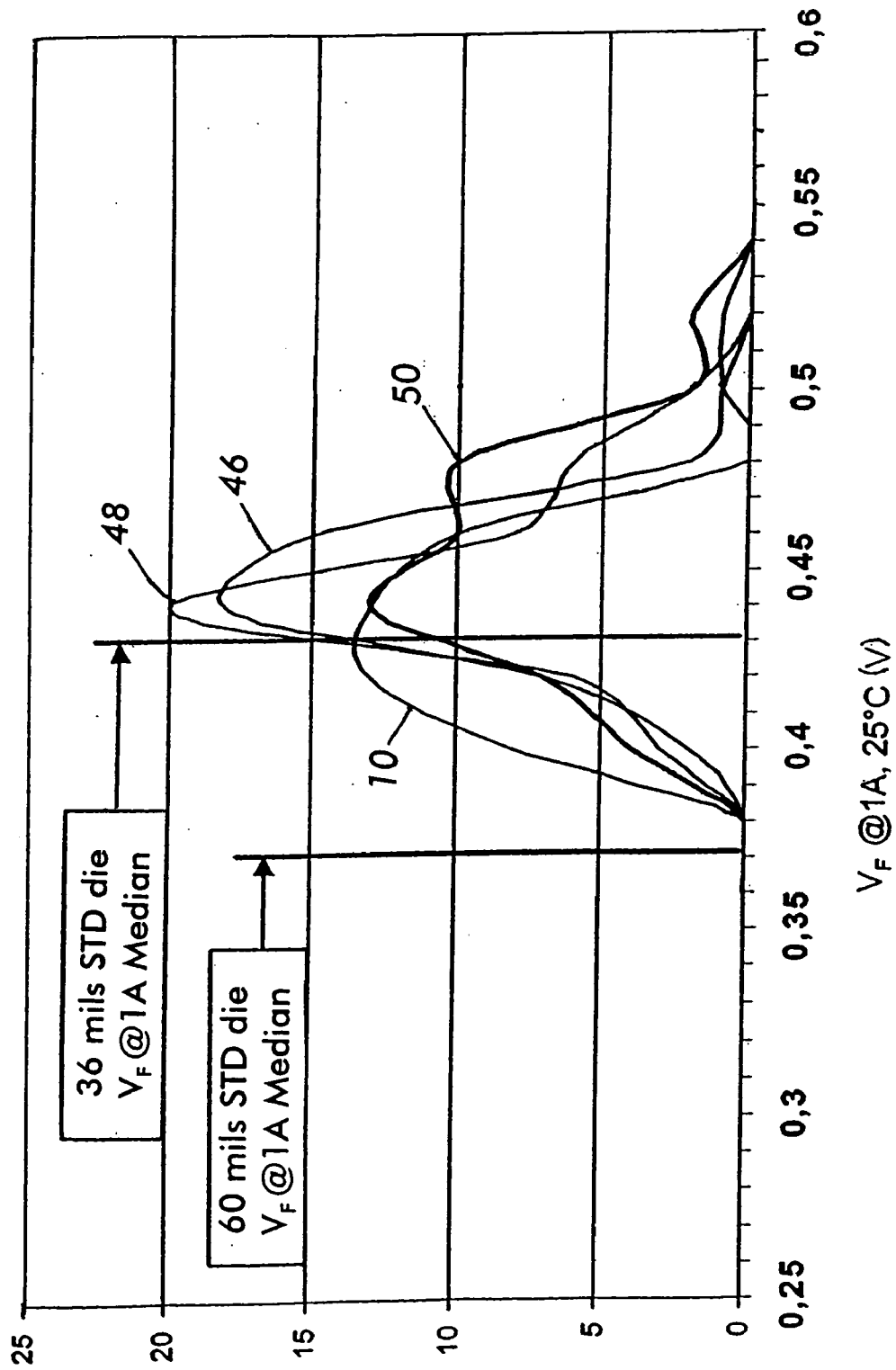
FIG. 9 graphically shows the experimental measurements for the $V_F$ of examples of the devices according to the embodiments shown by FIGS. 1–7.

FIG. 9 graphically shows the results of electrical tests on various examples of 60 mil devices according to the first 10, the second 46, the third 48 and the fourth 50 embodiments of the present invention as compared with standard 60 mils and 36 mils devices. As shown by FIG. 9, devices according to the present invention exhibit $V_F$ values comparable to 36 mil standard devices and slightly higher $V_F$ values than 60 mil standard devices.

Despite the increase in size to achieve the same performance as a standard 36 mil device, however, a device according to the present invention will ultimately occupy less space on a circuit board as illustrated by the data set out in Table 1.

| | FLIP-CHIP Vs SURFACE MOUNT | | | |
|---|---|---|---|---|
| | SURFACE-MOUNT | | FLIP-CHIP | |
| Part Number | 10MQ040N (SMA) | 20BQO3O (SMB) | A | B |
| Dimensions | | | | |
| Vertical Profile | 2.4 mm | 2.4 mm | 0.8 mm | 0.8 mm |
| Package Footprint | 13.3 mm$^2$ | 17.9 mm$^2$ | 2.3 mm$^2$ | 3.6 mm$^2$ |
| | 181 mil × 114 mil | 185 mil × 150 mil | 60 mil × 60 mil | 75 mil × 75 mil |
| Die Size | 36 mil × 36 mil | 50 mil × 50 mil | 60 mil × 60 mil | 75 mil × 75 mil |
| Anode Area | 0.472 mm$^2$ | 1.061 mm$^2$ | 1.069 mm$^2$ | 3.240 mm$^2$ |
| Forward Voltage | | | | |
| $V_f$ at 1A(V) | 0.54 | | 0.41 (0.44) | 0.35 (0.38) |
| $V_f$ at 2A(V) | | 0.47 | 0.47 (0.50) | 0.40 (0.43) |
| Leakage Current | | | | |
| Max $I_{RM}$ (μA) | 13 | 29 | 6(29) | 19(89) |

Figure 10:
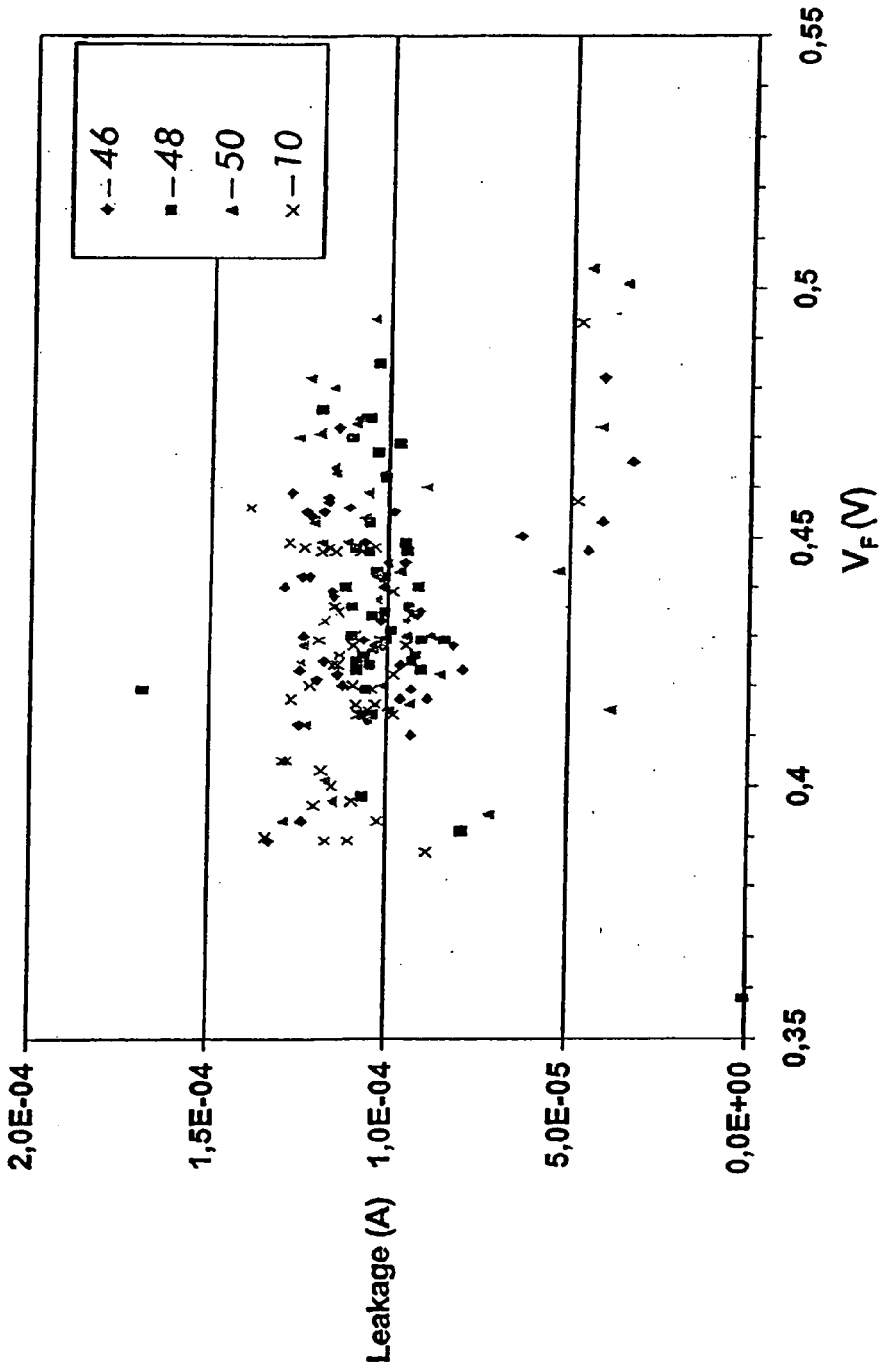
FIG. 10 shows a plot of experimental measurements of $V_F$ and leakage current for examples of the devices according to the embodiments shown by FIGS. 1–7.

Referring to FIG. 10, experiments have shown that the leakage current of the devices according to the first 10, the second 46, the third 48, and the fourth 50 embodiments of the present invention fall in the same general range. However, as shown by Table 2, experimental measurements have shown that device 10 according to the first embodiment of the present invention exhibits higher avalanche energy than the other embodiments.

TABLE 2

Avalanche Test

| Die # | Failed Energy per design type [mJ] | | | |
|---|---|---|---|---|
|  | 46 | 48 | 50 | 10 |
| 1 | 40.5 | x | x | 45.1 |
| 2 | 40.5 | 36.1 | 32.0 | 45.1 |
| 3 | 40.5 | x | 32.0 | 40.5 |
| 4 | 40.5 | 40.5 | 36.1 | 45.1 |
| 5 | 36.1 | 36.1 | 32.0 | x |
| 6 | 40.5 | 32.0 | 36.1 | 50.0 |
| 7 | 40.5 | 40.5 | 36.1 | 45.1 |
| 8 | 36.1 | 32.0 | 32.0 | 50.0 |
| 9 | 40.5 | 24.5 | 36.1 | 50.0 |
| 10 | 40.5 | 40.5 | 36.1 | 50.0 |
| Average | 39.6 | 35.3 | 34.4 | 46.8 |

A device according to the present invention may be produced by depositing or growing an oxide or some other insulation layer on a major surface of a die. At least one window may then be opened in the insulation layer to expose selected areas of the major surface over which the insulation layer is disposed. The sinker 28 may then be formed in the first portion 24 of die 20 by implantation followed by a diffusion drive. Next, a second window may be opened in the insulation layer to expose a preselected portion of the major surface of die 20. Next, the schottky barrier layer 22 may be deposited on the selected area exposed by the second window. The cathode electrode(s) 12 and the anode electrode 14 are then formed, followed by the formation of passivation layer 30. Next, openings are formed over cathode electrode(s) 12 and anode electrode 14 exposing portions of cathode electrode(s) 12 and anode electrode 14. A nickel flashing is then applied to portions of cathode electrode(s) 12 and anode electrode 14 exposed by the openings in the passivation layer 30. Next, solder bumps 18 are formed in the openings in the passivation layer 30.

Preferably, a plurality of devices according to the present invention are formed in a single wafer. The wafer is then diced after solder bumps 18 are formed to obtain a plurality of devices according to the present invention. Because the electrical contact for the anode and cathode is disposed on a common surface in a device according to the present invention, no back grinding or backside metal sputtering is required as is the case for vertical conduction devices.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising:
    a semiconductor die having a first major surface;
    a schottky barrier structure connected to a portion of said first major surface;
    a first electrode electrically connected to said schottky barrier structure;
    a second electrode electrically connected to said first major surface of said semiconductor die, but spaced from said first electrode;
    a plurality of solder bumps at least one of which is connected to one said first electrode and said second electrode; and
    a guard ring formed in said semiconductor die in a region at least partly between said first electrode and said second electrodes wherein said first electrode surrounds said second electrode, and wherein said semiconductor die includes a first lightly doped portion and a second highly doped portion, said first lightly doped portion being disposed over said second highly doped portion, and further comprising a sinker extending from a major surface of said first lightly doped portion to said second highly doped portion, wherein said second electrode is electrically connected to said sinker.

2. A semiconductor device package according to claim 1, further comprising a passivation layer disposed over said first electrode and said second electrode, wherein said plurality of solder bumps are disposed over a free surface of said passivation layer and extend through openings in said passivation layer to said first and second electrodes.

3. A semiconductor device package according to claim 1, wherein said guard ring is around the periphery of said second electrode.

4. A semiconductor device package comprising:
    a semiconductor die having a first major surface;
    a schottky barrier structure connected to a portion of said first major surface;
    a first electrode electrically connected to said schottky barrier structure;
    a second electrode electrically connected to said first major surface of said semiconductor die, but spaced from said first electrode;
    a plurality of solder bumps at least one of which is connected to one said first electrode and said second electrode; and
    a guard ring formed in said semiconductor die in a region at least partly between said first electrode and said second electrode, wherein said second electrode surrounds said first electrode, and wherein said semiconductor die includes a first lightly doped portion and a second highly doped portion, said first lightly doped portion being disposed over said second highly doped portion, and further comprising a sinker extending from a major surface of said first lightly doped portion to said second lightly doped portion, wherein said second electrode is electrically connected to said sinker.

5. A semiconductor device package according to claim 4, wherein said guard ring is around the periphery of said first electrode.

6. A semiconductor device package according to claim 1, wherein said schottky structure is a layer of molybdenum.

7. A semiconductor device package according to claim 1, wherein said first electrode is an anode electrode and said second electrode is a cathode electrode.

8. A semiconductor device package according to claim 1, wherein said semiconductor die includes a first lightly doped portion and a second highly doped portion, said first lightly doped portion being disposed over said second highly doped portion, and further comprising a sinker extending from a major surface of said first portion to said second portion, wherein said second electrode is electrically connected to said sinker.

9. A semiconductor device package according to claim 8, wherein said sinker comprises a highly doped region in said first lightly doped portion.

10. A semiconductor device package according to claim 1, further comprising a layer of nickel disposed between at least one of said plurality of solder bumps and its associated electrode.

11. A semiconductor device package according to claim 1, wherein said schottky structure comprises a layer of palladium.

12. A semiconductor device package according to claim 1, wherein said schottky structure comprises a layer of vanadium.

13. A semiconductor device package according to claim 1, wherein said first electrode comprises of aluminum.

14. A semiconductor device package according to claim 1, wherein said second electrode comprises aluminum.

15. A semiconductor device package according to claim 2, wherein said passivation layer comprises of silicon nitride.

16. A semiconductor device package according to claim 1, wherein said semiconductor die includes a second major surface opposite to said first major surface, said second major surface being free of any electrical connection.

17. A semiconductor device package according to claim 1, wherein said semiconductor die includes side edges which define lateral boundaries for said semiconductor device package.

18. A semiconductor device package according to claim 4, further comprising a passivation layer disposed over said first electrode and said second electrode, wherein said plurality of solder bumps are disposed over a free surface of said passivation layer and extend through openings in said passivation layer to said first and second electrodes.

19. A semiconductor device package according to claim 4, wherein said schottky structure is a layer of molybdenum.

20. A semiconductor device package according to claim 4, wherein said first electrode is an anode electrode and said second electrode is a cathode electrode.

21. A semiconductor device package according to claim 4, wherein said semiconductor die includes a first lightly doped portion and a second highly doped portion, said first lightly doped portion being disposed over said second highly doped portion, and further comprising a sinker extending from a major surface of said first portion to said second portion, wherein said second electrode is electrically connected to said sinker.

22. A semiconductor device package according to claim 21, wherein said sinker comprises a highly doped region in said first lightly doped portion.

23. A semiconductor device package according to claim 4, further comprising a layer of nickel disposed between at least one of said plurality of solder bumps and its associated electrode.

24. A semiconductor device package according to claim 4, wherein said schottky structure comprises a layer of palladium.

25. A semiconductor device package according to claim 4, wherein said schottky structure comprises a layer of vanadium.

26. A semiconductor device package according to claim 4, wherein said first electrode comprises of aluminum.

27. A semiconductor device package according to claim 4, wherein said second electrode comprises aluminum.

28. A semiconductor device package according to claim 18, wherein said passivation layer comprises of silicon nitride.

29. A semiconductor device package according to claim 4, wherein said semiconductor die includes a second major surface opposite to said first major surface, said second major surface being free of any electrical connection.

* * * * *